United States Patent
Su et al.

(10) Patent No.: US 6,515,077 B1
(45) Date of Patent: Feb. 4, 2003

(54) ELECTROSTRICTIVE GRAFT ELASTOMERS

(75) Inventors: Ji Su, Highland Park, NJ (US); Joycelyn S. Harrison, Hampton, VA (US); Terry L. St. Clair, Poquoson, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/696,528

(22) Filed: Oct. 23, 2000

Related U.S. Application Data

(60) Provisional application No. 60/161,160, filed on Oct. 22, 1999, and provisional application No. 60/161,113, filed on Oct. 22, 1999.

(51) Int. Cl.[7] ................ C08F 259/08; C08L 27/16; C08L 51/04
(52) U.S. Cl. ................ 525/276; 525/281; 525/72; 264/104; 526/242; 526/255
(58) Field of Search ................ 525/276, 281, 525/72; 264/104; 596/242, 255

(56) References Cited

U.S. PATENT DOCUMENTS

| | | |
|---|---|---|
| 3,801,839 A | 4/1974 | Yo |
| 4,151,225 A | 4/1979 | Büining |
| 4,472,557 A | 9/1984 | Kawashima et al. |
| 4,560,737 A | 12/1985 | Yamamoto et al. |
| 4,814,659 A | 3/1989 | Sawada |
| 4,910,258 A | 3/1990 | Inoue et al. |
| 5,447,994 A * | 9/1995 | Kruger et al. ............ 525/276 |
| 5,756,199 A | 5/1998 | Kerbow et al. |
| 5,835,453 A | 11/1998 | Wynne et al. |
| 5,949,029 A | 9/1999 | Crotzer et al. |

FOREIGN PATENT DOCUMENTS

| | | |
|---|---|---|
| JP | 1989000303675 | 11/1989 |
| JP | 1991000167234 | 7/1991 |
| WO | WO 98/35529 | 8/1998 |
| WO | WO 99/17929 | 4/1999 |

OTHER PUBLICATIONS

Su, J. et al., "Electrostrictive graft elastomers and applications", Mat. Res. Soc. Symp., vol. 6, Materials Research Society, Dec. 29–Jan. 1, 1999, pp. 131–136.

* cited by examiner

*Primary Examiner*—Nathan M. Nutter
*Assistant Examiner*—Olga Asinovsky
(74) *Attorney, Agent, or Firm*—Robin W. Edwards

(57) ABSTRACT

An electrostrictive graft elastomer has a backbone molecule which is a non-crystallizable, flexible macromolecular chain and a grafted polymer forming polar graft moieties with backbone molecules. The polar graft moieties have been rotated by an applied electric field, e.g., into substantial polar alignment. The rotation is sustained until the electric field is removed. In another embodiment, a process for producing strain in an elastomer includes: (a) providing a graft elastomer having a backbone molecule which is a non-crystallizable, flexible macromolecular chain and a grafted polymer forming polar graft moieties with backbone molecules; and (b) applying an electric field to the graft elastomer to rotate the polar graft moieties, e.g., into substantial polar alignment.

22 Claims, 5 Drawing Sheets

E=0  E=E₁  E=E₂  O<E₁ <E₂

ELECTROSTRICTIVE GRAFT ELASTOMERS

CLAIM OF BENEFIT OF PROVISIONAL APPLICATION

Pursuant to 35 U.S.C. §119, the benefit of priority from provisional applications Nos. 60/161,160 and 60/161,113, both with a filing date of Oct. 22, 1999, is claimed for this non-provisional application.

ORIGIN OF THE INVENTION

This invention was jointly made by employees of the U.S. Government and an employee of the National Research Council and may be manufactured and used by or for the government for governmental purposes without the payment of royalties thereon or therefor.

BACKGROUND OF THE INVENTION

1. Field of the Invention

This invention relates to graft elastomers which are electrostrictive. It relates also to a process for producing strain in elastomers.

2. Description of the Related Art

Electromechanical coupling effects such as piezoelectricity and electrostriction have been utilized in a number of transducer and actuator technologies. Piezoelectric polymers and ceramics have been the typical candidates for actuation mechanisms. However, piezoelectric polymers such as poly(vinylidene fluoride) provide very low strains, while the ceramics are undesirably heavy and brittle, and provide low strains. To be sure, acceptable strains are now provided by electrostrictive polyurethanes and silicones. However, these polymeric materials have very low moduli, and consequently possess very little actuation authority.

Fluorine-containing graft copolymers have been known for some time. For example, U.S. Pat. Nos. 4,472,557 and 4,910,258 disclose the graft copolymerization of fluorine-containing elastomeric polymers with fluorine-containing crystalline polymers. Although it has been recognized that such graft copolymers possess desirable properties for certain applications, there has been no disclosure or suggestion in the art that such polymers could be transformed to provide a high strain energy density and therefore be suitable as actuation materials.

SUMMARY OF THE INVENTION

It is a primary object of the present invention, to provide what is not available in the art, viz., an electrostrictive polymeric material which provides the combination of high strain energy density, low mass, excellent conformability and processability, and mechanical and electrical toughness for durability. Such an electrostrictive material would be highly desirable as an actuation material for a wide variety of applications where electrically controlled mechanical motions are required.

It is also a primary object of the present invention to provide a process for producing an elastomer of high strain energy density, low mass, excellent conformability and processability, and mechanical and electrical toughness for durability.

These primary objects, and other attending benefits, are achieved respectively by the provision of two preferred embodiments of the present invention. In the first, an electrostrictive graft elastomer is provided having a backbone molecule which is a non-crystallizable, flexible macromolecular chain, and a grafted polymer forming polar graft moieties with backbone molecules, the polar graft moieties having been rotated by an applied electric field, advantageously into substantial polar alignment. The backbone molecule is advantageously a member selected from the group consisting of silicones, polyurethanes, polysulfides, nitrile rubbers, polybutenes, and fluorinated elastomers, e.g., a chlorotrifluoroethylene-vinylidene fluoride copolymer. The grafted polymer is a homopolymer or a copolymer, and the polar graft moieties are polar crystal phases and physical entanglement sites with backbone molecules. The grafted polymer is preferably a member selected from the group consisting of poly(vinylidene fluoride) and poly(vinylidene fluoride-trifluoroethylene) copolymers. Other suitable grafted polymers are poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolymers, poly(cyanoaryl ether)), polyureas, polythioureas, ferroelectric liquid crystal polymers and piezoelectric bipolymers. In a particularly preferred embodiment, the backbone molecule is a chlorotrifluoroethylene-vinylidene fluoride copolymer, and the grafted polymer is a poly(vinylidene fluoride) or a poly(vinylidene fluoride-trifluoroethylene) copolymer. The polar graft moieties, which are polar crystal phases and physical entanglement sites with backbone molecules, have been rotated by an applied electric field, advantageously into substantial polar alignment.

In the second preferred embodiment of the present invention, a process is presented which includes providing a graft elastomer having a backbone molecule which is a non-crystallizable, flexible macromolecular chain and a grafted polymer which forms polar graft moieties with backbone molecules. An electric field is applied to this graft elastomer to rotate the polar graft moieties, advantageously into substantial polar alignment, resulting in an elastomer of high strain energy density. In this process, the backbone molecule of the graft elastomer is advantageously a member selected from the group consisting of silicones, polyurethanes, polysulfides, nitrile rubbers, polybutenes, and fluorinated elastomers, such as chlorotrifluoroethylene-vinylidene fluoride copolymers. In this process, the grafted polymer is a homopolymer or a copolymer, preferably a member selected from the group consisting of poly(vinylidene fluoride) and poly(vinylidene fluoride-trifluoroethylene) copolymers, and the polar graft moieties are polar crystal phases and physical entanglement sites with the backbone molecules.

The electrostrictive graft elastomer of the present invention, which is the elastomer produced by the process of the present invention, is useful as an actuation material in applications where electrically controlled mechanical motions are required.

BRIEF DESCRIPTION OF THE DRAWINGS

For a more complete understanding of the present invention, including its primary objects and attending benefits, reference should be made to the Detailed Description of the Invention, which is set forth below. This Detailed Description should be read with reference to the accompanying Drawings, wherein.

DETAILED DESCRIPTION OF THE INVENTION

Figure 1:
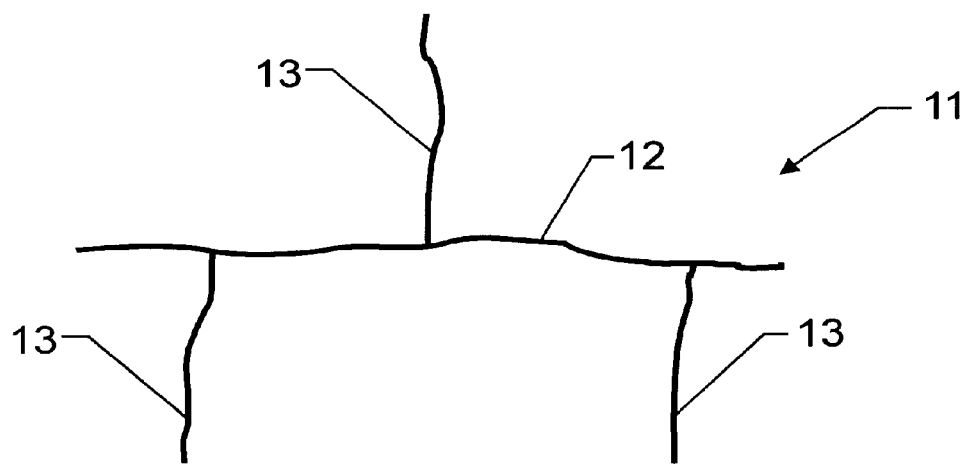
FIG. 1 is a schematic representation of the molecular structure of a graft elastomer employed in the present invention.

Referring now to the drawings, FIG. 1 shows schematically the molecular structure of a graft elastomer 11 employed in the present invention. Graft elastomer 11 includes backbone molecule 12, which a non-crystallizable, flexible macromolecular chain, and grafted polymer 13, which forms polar graft moieties 14, as shown in FIG. 2, with backbone molecule 12.

Figure 2:
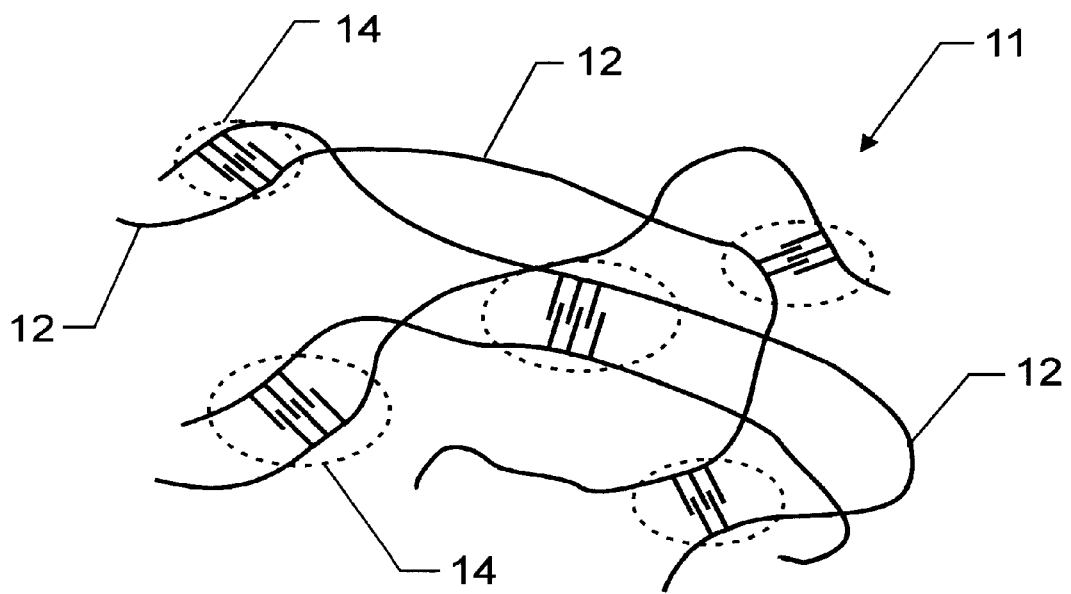
FIG. 2 is a schematic representation of the morphology of a graft elastomer employed in the present invention.

FIG. 2 schematically represents the morphology of graft elastomer 11, showing backbone molecules 12, which constitute soft segments, and crystal phases/entanglement sites 14, which are formed from the grated polymer segments 13 and constitute hard segments.

As a preferred embodiment, graft elastomer 11 contains poly(vinylidene fluoride), (PVDF), as the grafted polymer 13 and chlorotrifluoroethylene-vinylidene fluoride copolymer as backbone molecule 12. However, the grafted polymer may be any homopolymer or copolymer which forms polar crystal phases/physical entanglement sites 14 with backbone molecules 12. Also preferred for grafted polymer 13 are poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolymers, poly (cyanoaryl ether)), polyureas, polythioureas, ferroelectric liquid crystal polymers or piezoelectric bipolymers). In addition, backbone molecule 12 may be any member selected from the group consisting of silicones, polyurethanes, polysulfides, nitrile rubbers, polybutenes, and fluorinated elastomers. The preparation of all such polymeric components is well understood by one of skill in this art. In particular, U.S. Pat. Nos. 4,472,557 and 4,910, 258 disclose the graft copolymerization of fluorine-containing elastomeric polymers with fluorine-containing crystalline polymers.

Figure 3:
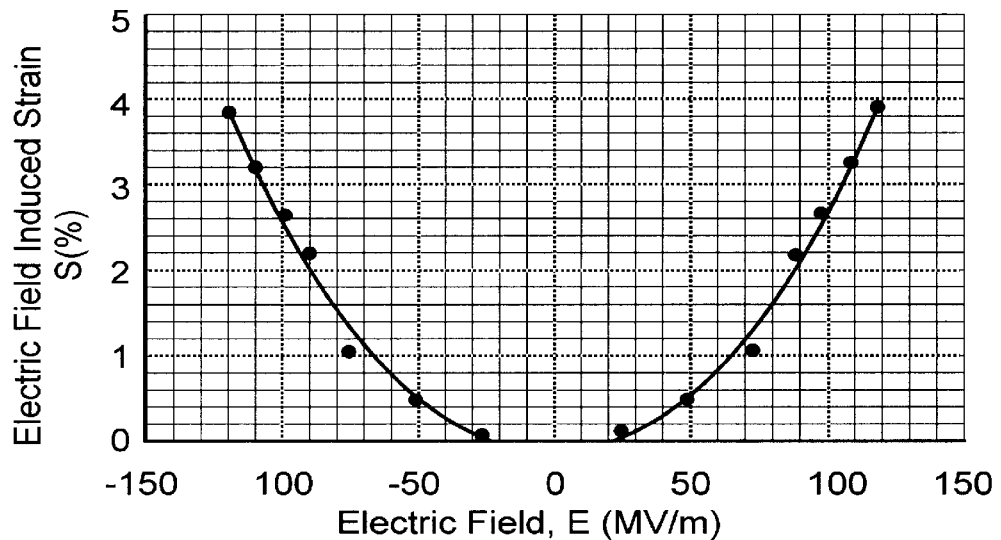
FIG. 3 is a graph showing the relationship between electric field induced strain and applied electric field for an electrostrictive graft elastomer according to the present invention.

In the especially preferred embodiment presented above, polyvinylidene fluoride crystals are electrically poled to become the polar phase. Reorientation of the polar phase results in dimensional change in both the longitudinal and transverse directions when an electric field is applied. FIG. 3 is a graph showing the relationship between electric field induced strain and the applied electric field for this preferred embodiment. As seen in FIG. 3, the electric field induced strain can be as large as about 4 percent. In addition to the large electric field induced strain, the electrostrictive graft elastomer of the present invention also has mechanical modulus of about 580 MPa, which is about thirty times that of the modulus of electrostrictive polyurethane elastomers (20 MPa). Accordingly, the mechanical energy density, or output power, of the electrostrictive graft elastomer of the present invention is significantly higher than that achievable from the polyurethane elastomers. A comparison of electrical, mechanical, and electromechanical properties of these electrostrictive elastomers is presented in Table I.

TABLE I

| Elastomer | Y (GPa) | Density (d) | S (%) | $YS^2/2$ (J/cm$^3$) | $YS^2/2$ d (J/kg) |
|---|---|---|---|---|---|
| Instant electrostrictive graft elastomer | 0.58 | 1.78 | 4 | 0.46 | 258 |
| Electrostrictive polyurethane elastomer | 0.02 | 1.14 | 4 | 0.016 | 13 |

Figure 4:
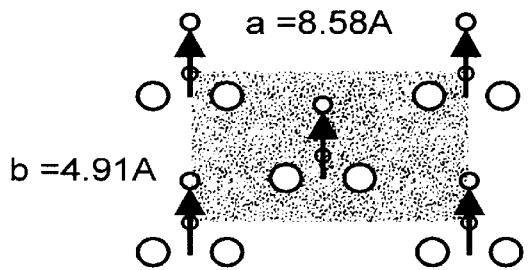
FIG. 4 is a schematic representation of a polar crystal phase unit cell in a graft elastomer employed in the present invention.
Figure 5:
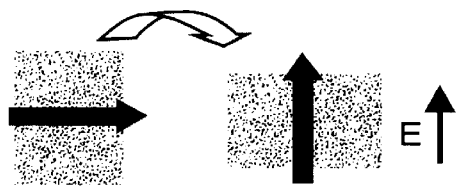
FIG. 5 schematically depicts reorientation of the polar crystal phase unit cell of FIG. 4 under an applied electric field.

Y Mechanical modulus.
S Induced Strain.
$YS^2/2$ d Strain energy density, where d is material density Based on experimental results and study of molecular structure and morphology, a molecular model has been proposed to understand mechanisms of electric field induced strain in the electrostrictive graft elastomer of the present invention. FIG. 4 shows the polar phase of poly(vinylidene fluoride) and its dimensions. The net polar direction of the polar phase is along the b direction. The difference between the directions parallel and perpendicular to the polar direction can be as large as about 40% (from 8.58 A to 4.91 A). Due to the dimensional difference in the directions parallel and perpendicular to the polar direction, reorientation of the poly(vinylidene fluoride) polar phase under an applied electric field results in the dimensional change. FIG. 5 schematically depicts reorientation of the polar crystal phase unit cell of FIG. 4 under an applied electric field. The contribution of the dimensional change of the polar phase to the entire graft system is determined by the relative composition of the grafted polar phase and the flexible backbone phase. In this two-phase system, total strain $S=S_1J_1+S_2J_2$, wherein the subscript 1 represents the flexible backbone phase, and the subscript 2 represents the polar crystal phase.

Figure 6:
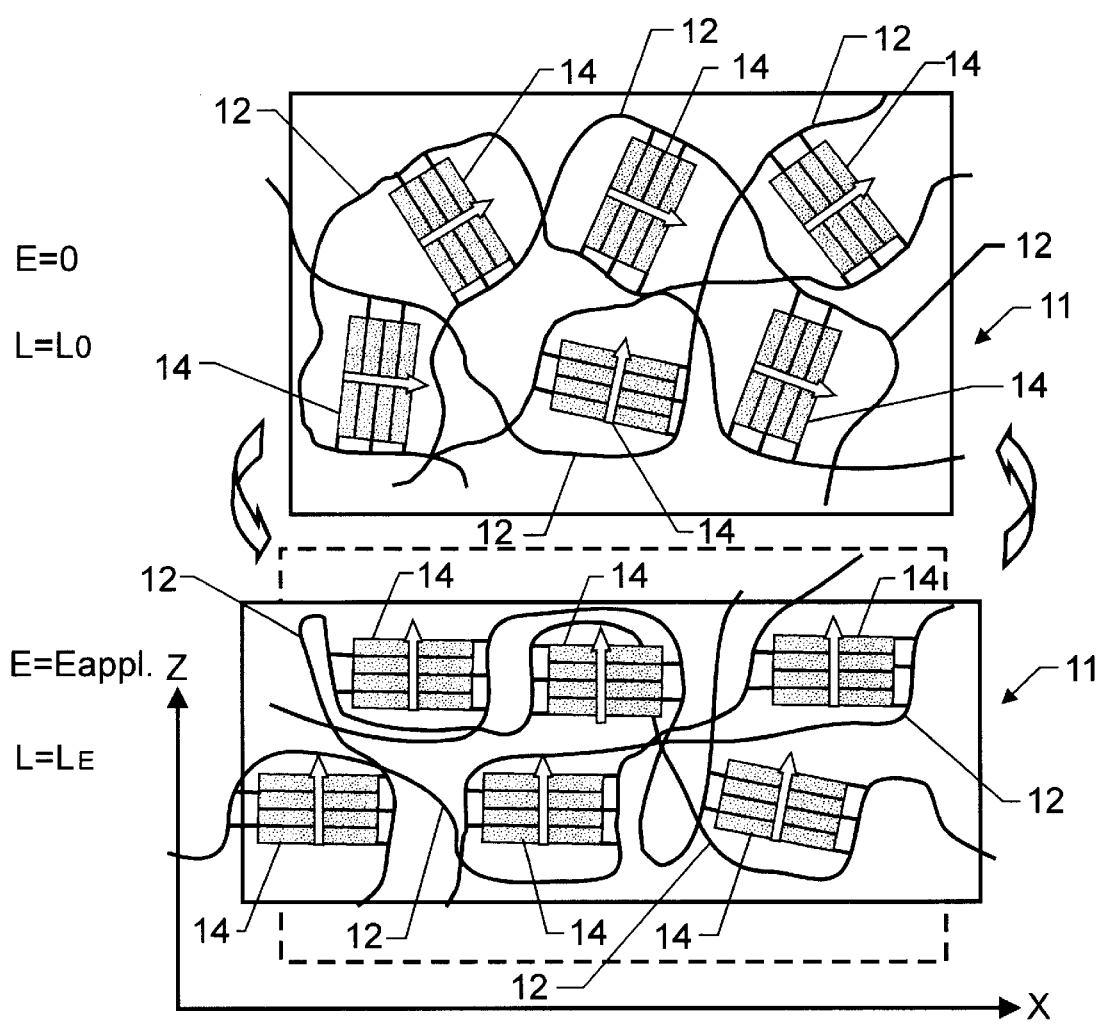
FIG. 6 schematically depicts rotation and reorientation of polar crystal phases in a graft elastomer from an originally randomly distributed configuration to a substantial polar alignment when an electric field is applied.
Figure 7:
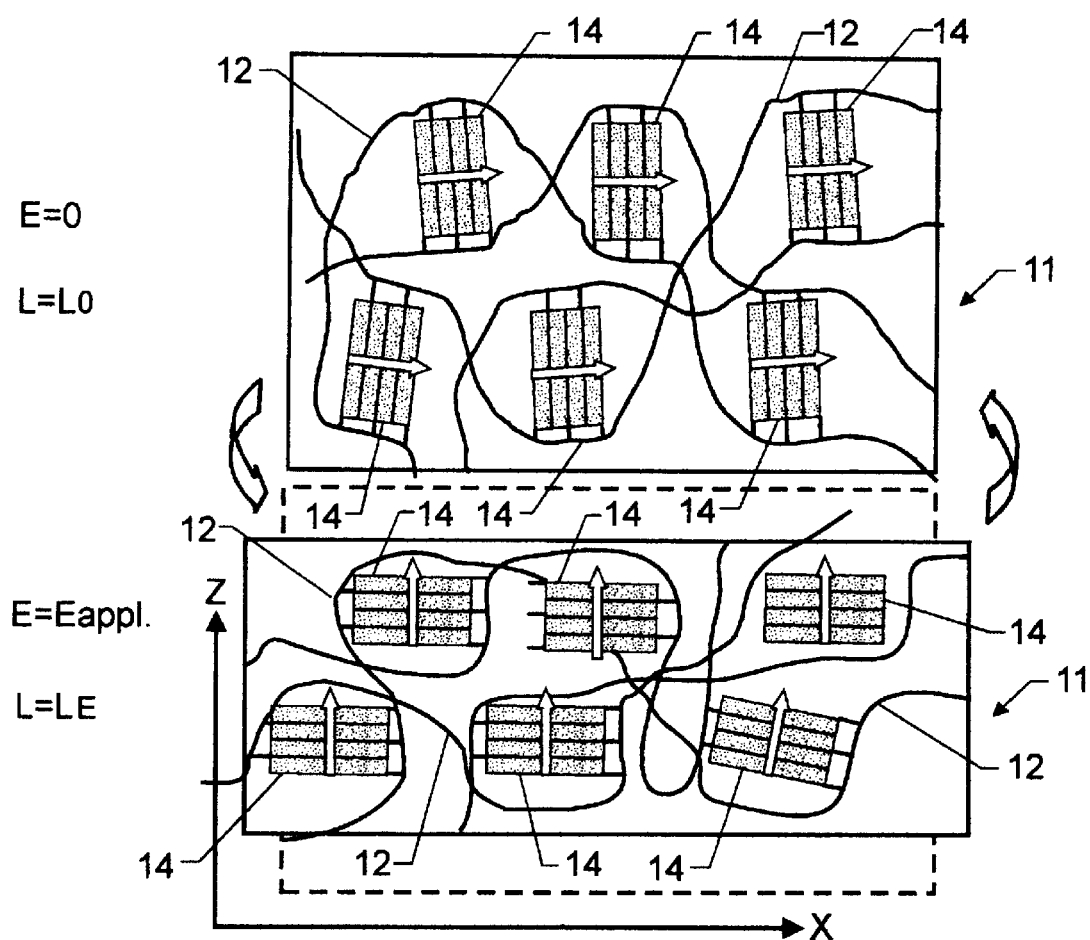
FIG. 7 schematically depicts rotation and reorientation of polar crystal phases in a graft elastomer from an originally electrically aligned configuration to a second substantial polar alignment upon application of an electric field.

The polar graft component 13 functions as both the electroactive unit and the crosslinking agent between flexible backbone components 12. The polar phase will be reoriented when an electric field is applied. The reorientation leads to a dimensional change in both longitudinal and lateral (or transverse) directions. The two expected mechanisms, which should contribute to the dimensional change, are schematically represented in FIGS. 6 and 7. FIG. 6 depicts the mechanism for a system with originally randomly distributed polar phases 14, while FIG. 7 depicts the mechanism for a system with originally electrically aligned polar phases 14. Rotation of the polar graft moieties is sustained until removal of the electric field. The electrical (such as dielectric constant, loss, and strength) and mechanical (such as modulus, loss, and toughness), as well as electromechanical properties (such as field induced strain, actuation power, and efficiency) are optimized by adjusting the relative fraction of the two components in the graft elastomer to meet the performance requirements of a material for a particular application. Other design parameters are (1) processing, including thermal, mechanical, and electrical (poling) for morphology control, including degree of crystallinity, crystal distribution, crystal size, and crystal orientation, (2) molecular synthesis/selection of appropriate backbone and grafted polymer, and (3) variation of the molecular weight of the two constituent polymers, especially the graft polymer to control size of the crystalline phases.

Figure 8:
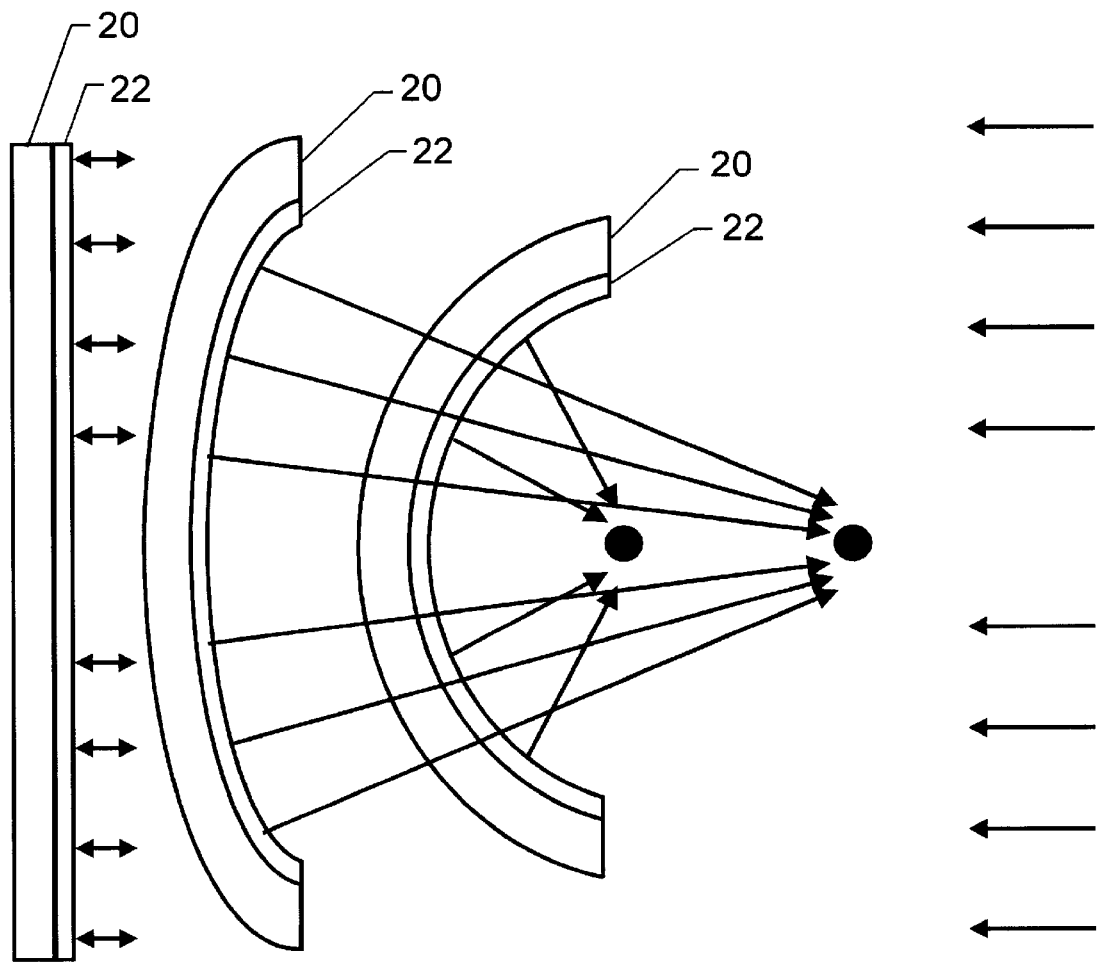

The electrostrictive graft elastomer of the present invention has been successfully employed in preparing a polymer-polymer bending actuator which provides a significant bending displacement when an electric field is applied. The electrostrictive graft elastomer could also function as a membrane to be deformed, such as the reflector shown in FIG. 8. The electrostrictive graft elastomer 20 can be reflectively coated 22 as needed and electroded in an array pattern that will allow selective tuning of the entire surface.

The electrostrictive graft elastomer of the preferred embodiment of the present invention was compared with other electroactive polymeric and ceramic materials. Key properties of these materials are presented in the following Table II.

TABLE II

| Material | Strain (s)(%) | Modulus (Y)(MPa) | Output Force[1] (MPa) | Strain Energy Density[2] (J/kg) | Salient Features |
|---|---|---|---|---|---|
| This invention | 6 | 190 | 11.4 | 192 | conformable, high strain, lightweight |
| Polyurethane | 4 | 20 | 0.8 | 13 | high strain, low force |
| Poly(vinylidene fluoride) | 0.3 | 1,600 | 4.8 | 4 | low strain |
| Ceramic | 0.3 | 64,000 | 192 | 38 | brittle, heavy |

[1]Output Force is calculated as Ys.
[2]Strain Energy Density is calculated as $YS^2/2d$, where d is material density.

We Claim:

1. An electrostrictive graft elastomer comprising a backbone molecule which is a non-crystallizable, flexible macromolecular chain, and a grafted polymer forming polar graft moieties with backbone molecules, the polar graft moieties having been rotated by an applied electric field, wherein the rotation is sustained until the electric field is removed.

2. The electrostrictive graft elastomer of claim 1 wherein the polar graft moieties have been rotated into substantial polar alignment.

3. The electrostrictive graft elastomer of claim 1, wherein the backbone molecule is a member selected from the group consisting of silicones, polyurethanes, polysulfides, nitrile rubbers, polybutenes, and fluorinated elastomers.

4. The electrostrictive graft elastomer of claim 3, wherein the backbone molecule is a chlorotrifluoroethylene-vinylidene fluoride copolymer.

5. The electrostrictive graft elastomer of claim 1, wherein the grafted polymer is a homopolymer or a copolymer, and the polar graft moieties are polar crystal phases and physical entanglement sites with backbone molecules.

6. The electrostrictive graft elastomer of claim 5, wherein the grafted polymer is a member selected from the group consisting of poly(vinylidene fluoride) poly(vinylidene fluoride-trifluoroethylene) copolymers , poly (trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolymers, poly (cyanoaryl ether)), polyureas, polythioureas, ferroelectric liquid crystal polymers and piezoelectric bipolymers.

7. The electrostrictive graft elastomer of claim 1, wherein the backbone molecule is a chlorotrifluoroethylene-vinylidene fluoride copolymer, the grafted polymer is a member selected from the group consisting of poly (vinylidene fluoride) and poly(vinylidene fluoride-trifluoroethylene) copolymers, and the polar graft moieties are polar crystal phases and physical entanglement sites with backbone molecules, which polar graft moieties have been rotated by an applied electric field.

8. The electrostrictive graft elastomer of claim 7, wherein the polar graft moieties have been rotated into substantial polar alignment.

9. The electrostrictive graft elastomer of claim 1, wherein the relative composition of the grafted polymer and the backbone are adjusted to achieve desired mechanical, electrical, and electromechanical properties.

10. The electrostrictive graft elastomer of claim 1, wherein processing of the electrostrictive graft elastomer controls the morphology.

11. The electrostrictive graft elastomer of claim 10, wherein the processing is selected from the group consisting of thermal, mechanical and electrical.

12. The electrostrictive graft elastomer of claim 1, wherein the molecular weight of the backbone and the grafted polymer are selected to achieve desired properties.

13. A process for producing strain in an elastomer, which process comprises: (a) providing a graft elastomer comprising a backbone molecule which is a non-crystallizable, flexible macromolecular chain, and a grafted polymer forming polar graft moieties with backbone molecules; and (b) applying an electric field to the graft elastomer to rotate the polar graft moieties until electric field removal.

14. The process of claim 13, wherein the polar graft moieties are rotated into substantial polar alignment.

15. The process of claim 13, wherein the backbone molecule of the graft elastomer is a member selected from the group consisting of silicones, polyurethanes, polysulfides, nitrile rubbers, polybutenes, and fluorinated elastomers.

16. The process of claim 15, wherein the backbone molecule is a chlorotrifluoroethylene-vinylidene fluoride copolymer.

17. The process of claim 13, wherein the grafted polymer is a homopolymer or a copolymer, and the polar graft moieties are polar crystal phases and physical entanglement sites with backbone molecules.

18. The process of claim 17, wherein the grafted polymer is a member selected from the group consisting of poly (vinylidene fluoride) and poly(vinylidene fluoride-trifluoroethylene) copolymers, poly(trifluoroethylene), vinylidene-trifluoroethylene copolymers, ferroelectric nylons (odd-numbered nylons), cyanopolymers (polyacrylonitriles, poly(vinylidene cyanide, vinylidene cyanide-based copolymers, poly(cyanoaryl ether)), polyureas, polythioureas, ferroelectric liquid crystal polymers and piezoelectric bipolymers.

19. The process of claim 13, wherein the process further comprises adjusting the relative composition of the grafted polymer and the backbone to achieve desired mechanical, electrical, and electromechanical properties.

20. The process of claim 13, wherein the process further comprises controlling the morphology by processing of the electrostrictive graft elastomer.

21. The electrostrictive graft elastomer of claim 20, wherein the processing is selected from the group consisting of thermal, mechanical and electrical.

22. The process of claim 13, wherein the process further comprises selecting the molecular weight of the backbone and the grafted polymer to achieve desired properties.

* * * * *